United States Patent [19]
Aoyama et al.

[11] Patent Number: 5,345,336
[45] Date of Patent: Sep. 6, 1994

[54] MICRO ASPHERICAL LENS AND FABRICATING METHOD THEREFOR AND OPTICAL DEVICE

[75] Inventors: Shigeru Aoyama, Takatsuki; Tsukasa Yamashita, Nara; Shiro Ogata, Kyoto, all of Japan

[73] Assignee: Omron Tateisi Electronics Co., Kyoto, Japan

[21] Appl. No.: 899,374

[22] Filed: Jun. 16, 1992

Related U.S. Application Data

[62] Division of Ser. No. 434,029, Nov. 9, 1989, Pat. No. 5,148,322.

[51] Int. Cl.$^5$ .................. G02B 27/44; G02B 13/18
[52] U.S. Cl. .................. 359/628; 359/563; 359/569
[58] Field of Search ............ 359/708, 622, 623, 628, 359/563, 569

[56] References Cited

U.S. PATENT DOCUMENTS

| | | | |
|---|---|---|---|
| 3,580,675 | 5/1971 | Hieber et al. | 359/628 |
| 4,305,643 | 12/1981 | Tosswill | 359/623 |
| 4,515,444 | 5/1985 | Prescott et al. | 359/654 |
| 4,572,611 | 2/1986 | Bellman et al. | 430/322 X |
| 4,689,479 | 8/1987 | Tatsuno et al. | 250/201 |
| 4,813,762 | 3/1989 | Leger et al. | 359/565 |
| 4,842,633 | 6/1989 | Kuribayashi et al. | |
| 4,877,717 | 10/1989 | Suzuki et al. | 430/321 |
| 4,888,076 | 12/1989 | Martin | 156/245 |
| 4,948,214 | 8/1990 | Hamblen | 359/654 |

FOREIGN PATENT DOCUMENTS

| | | |
|---|---|---|
| 57-185401 | 11/1982 | Japan . |
| 62-161532 | 7/1987 | Japan . |
| 62-161533 | 7/1987 | Japan . |
| 1-261601 | 10/1989 | Japan . |

*Primary Examiner*—Scott J. Sugarman
*Attorney, Agent, or Firm*—Dickstein, Shapiro & Morin

[57] ABSTRACT

An imaging device is formed by a transparent substrate having opposite surfaces on which are formed a plurality of micro aspherical lenses. The axes of the lenses on one surface coincide with the axes of respective lenses on the other surface. A two-dimensional micro lens array constructed by arranging converging lenses having a diameter of approximately several to several hundred micrometers is arranged ahead of a light source, thereby forming a multi-beam spot caused by diffraction in a distant position. A three-dimensional shape can be recognized with high precision by shape recognition means utilizing this multi-beam spot.

14 Claims, 15 Drawing Sheets

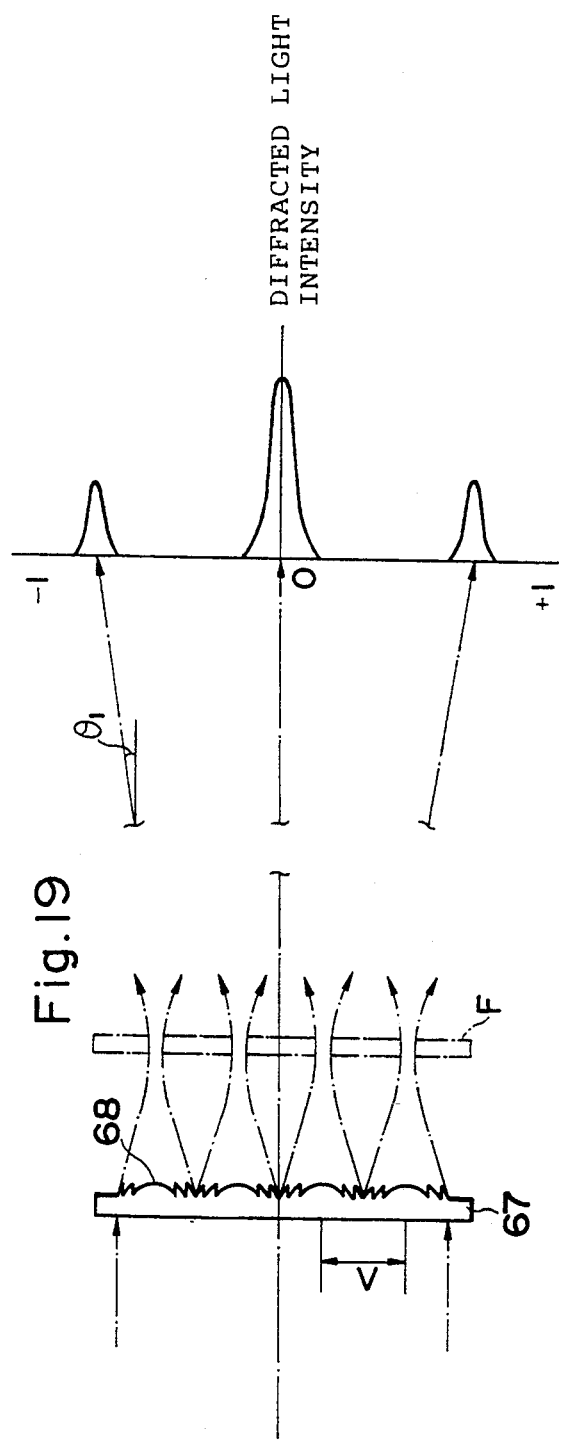
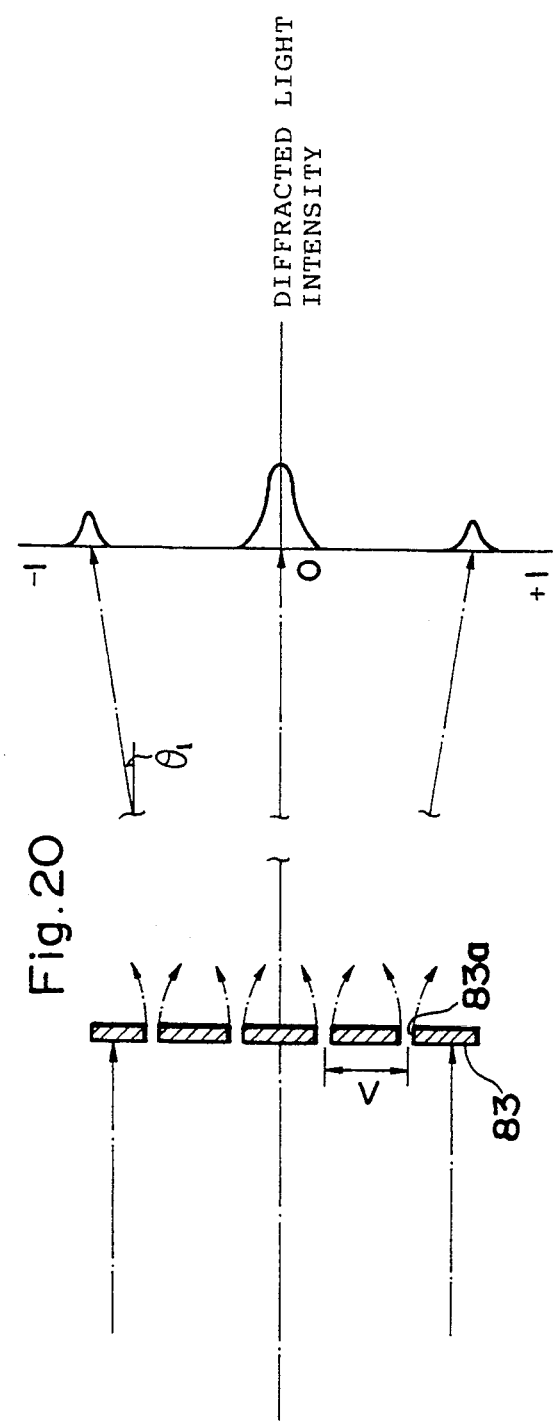

MICRO ASPHERICAL LENS AND FABRICATING METHOD THEREFOR AND OPTICAL DEVICE

This application is a division of application Ser. No. 07/434,029 filed Nov. 9, 1989 now U.S. Pat. No. 5,148,322.

BACKGROUND OF THE INVENTION

1. Field of the Invention

The present invention relates to micro aspherical lenses and a fabricating method therefor, and optical fiber coupling devices, focusing optical systems, optical devices, semiconductor laser light sources and image devices utilizing the micro aspherical lenses as well as multi-beam projectors.

2. Description of the Background Art

Micro lenses have the advantage of compactness and light weight. Micro lenses heretofore known include (a) a ball lens, (b) an ion exchange flat micro lens, and (c) a Fresnel lens. In addition, aspherical lenses have the advantage of causing no aberration. Aspherical lenses heretofore known include, for example, (d) an aspherical plastic lens used in an optical pick-up of an optical disk. However, the lenses have various disadvantages as described in the following.

(a) Ball Lens

The lens causes on-axis aberration. Accordingly, if the lens is used for optical coupling between an optical fiber and a semiconductor laser and between optical fibers, optical coupling efficiency is reduced. In addition, it is difficult to apply the lens to a precision optical system such as an optical pick-up.

(b) Ion-Exchange Flat Micro Lens

The lens is fabricated by ion exchange on a glass substrate. Accordingly, it takes approximately ten hours to fabricate the lens. In addition, the lens is not suitable for quantity production because it can not be reproduced.

(c) Fresnel Lens

The lens utilizes diffraction of light. Accordingly, the lens causes chromatic aberration in a light source where wavelength dispersion occurs.

(d) CD Aspherical Plastic Lens

The lens is 4 to 5 mm in diameter and 3 to 4 mm in thick. Accordingly, it is difficult to miniaturize, integrate and hybridize an optical system.

On the other hand, optical systems used in a multi-beam projector for projecting a lot of spotlights caused by diffraction, for example, a multi-beam projector used for shape recognition, for forming a multi-beam spot caused by diffraction include, for example, a fiber grating and an amplitude modulation grating, and an incoherent type lens array utilizing a focusing spot.

FIGS. 23, 24a and 24b illustrate a fiber grating. The fiber grating is constructed by arranging a plurality of optical fibers 81 in parallel with each other and arranging a plurality of optical fibers 82 in parallel with each other in the X direction so as to be overlapped with the optical fibers 81. In the fiber grating, however, the position of spots formed by light converged in the Y direction by the optical fibers 81 and the position of spots formed by light converged in the X direction by the optical fibers 82 are shifted by $\Sigma f$, as shown in FIGS. 24a and 24b. Therefore, the spots are blurred, thereby causing diffracted light spots $P_{S2}$ to be blurred.

FIG. 25 illustrates an amplitude modulation grating. An opaque flat plate 83 is provided with holes 83a arranged at constant intervals, to obtain light spots $P_{S3}$ utilizing diffraction of light which is transmitted through the holes. In the amplitude modulation grating, light which is not transmitted through the opaque flat plate 83 can not be utilized, so that use efficiency of light is low.

FIG. 26 illustrates an incoherent type lens array, which is constructed by arranging convex lenses 84 having a diameter of several millimeters or less in a two-dimensional manner. A lot of light spots $P_{S4}$ are formed on the focal plane of the convex lenses 84, so that the focal depth of the spots is small.

Additionally, optical systems used for shape recognition include a cylindrical lens 85 as shown in Fig. 27. In the optical system using the cylindrical lens 85, an object to be detected 86 is illuminated by slit light Accordingly, only a two-dimensional shape can be recognized. In addition, if the object 86 to be detected is displaced in the Z direction (the direction of the principal axis), the position illuminated by the slit light is changed.

SUMMARY OF THE INVENTION

An object of the present invention is to provide a micro aspherical lens making use of the advantage of a micro lens that it is small in size and lightweight and incorporating the advantage of an aspherical lens that it causes no aberration and a method of fabricating the same.

Another object of the present invention is to provide an optical fiber coupling device, a focusing optical system, an optical device, a semiconductor laser light source and an image device utilizing a micro aspherical lens.

A further object of the present invention is to provide a multi-beam projector in which light spots are not blurred, use efficiency of light is high and the change in diameter of the spots is smaller relative to the change in distance and which can be utilized for recognizing a three-dimensional shape.

A first embodiment of the present invention is directed to a method of fabricating a micro aspherical lens, which is characterized by comprising the steps of applying an electron-beam resist over a substrate on which a micro aspherical lens is to be fabricated so as to have a thickness larger than the maximum thickness of the micro aspherical lens to be fabricated, writing a predetermined pattern on this resist using an electron-beam lithography system so as to irradiate an electron beam in amounts of irradiation corresponding to the thickness of the micro aspherical lens to be fabricated, and then developing the resist, thereby to fabricate a micro aspherical lens formed of the remaining resist and the prototype thereof.

A second embodiment of the present invention is directed to a method of fabricating a micro aspherical lens, which is characterized by fabricating an aspherical lens or its stamper by transferring onto a substrate a remaining resist having a convex portion in the form of an aspherical lens or a remaining resist having a concave portion of the same shape fabricated by the method according to the above described first embodiment of the present invention by dry etching.

A method of fabricating a micro aspherical lens according to a third embodiment of the present invention is characterized by fabricating a stamper using as a prototype the remaining resist in the form of the aspherical lens fabricated by the method according to the above described first embodiment of the present invention or a remaining resist having a concave portion in the form of a micro aspherical lens to be fabricated, to form a micro aspherical lens using this stamper.

A fourth embodiment of the present invention is directed to a micro aspherical lens, which is fabricated by the method according to any one of the above described first, second and third embodiments of the present invention.

According to the first, second and fourth embodiments of the present invention, the micro aspherical lens can be fabricated by electron-beam lithography. Accordingly, a compact and lightweight micro lens having a diameter of 1 millimeter or less can be fabricated with high precision. An aspherical lens has an aspherical shape and thus, causes no on-axis aberration, unlike the ball lens. In addition, the aspherical lens has no periodic structure and thus, causes no chromatic aberration, unlike the Fresnel lens. Consequently, a micro aspherical lens having both advantages of the micro lens and the aspherical lens can be achieved.

Furthermore, according to the third embodiment of the present invention, the micro aspherical lens can be reproduced by formation or molding using a stamper. Consequently, the micro aspherical lens is suitable for quantity production and can be provided at low cost.

In an optical fiber coupling device in which optical coupling between two optical fibers is achieved by collimating light emitted from one of the optical fibers by a first lens and converging this collimated light at an end of the other optical fiber by a second lens, the optical fiber coupling device according to a fifth embodiment of the present invention is characterized by using micro aspherical lenses as the above first and second lenses.

An optical fiber coupling device small in size and high in coupling efficiency is obtained by using a micro aspherical lens. The micro aspherical lens can be also applied to a single-mode optical fiber having a small core diameter because it is significantly compact and causes no aberration.

A sixth embodiment of the present invention is characterized by directly providing a micro aspherical lens at an end of a converging rod lens in a focusing optical system using the converging rod lens as a basic optical device.

According to the sixth embodiment of the present invention, the micro aspherical lens is provided at the end of the rod lens. Consequently, a focusing optical system high in coupling efficiency, small in size and simple in structure can be achieved. In addition, when the focusing optical system is used for optical measurement, a high NA (Numerical Aperture) and a large operating distance can be achieved. The use of this focusing system broadens the range of applications such as optical coupling between a light emitting/receiving device and an light propagating device (e.g., optical fiber) in the field of optical communication or optical measurement.

An optical device according to a seventh embodiment of the present invention is characterized by providing a micro aspherical lens on a surface, through which light passes, of this optical device.

Optical devices to which the seventh embodiment of the present invention is applied include, for example, a prism, a beam splitter, a polarizer, an analyzer and a wavelength plate.

According to the seventh embodiment of the present invention, a single optical device can have a function of, for example, converging and collimating light by a micro aspherical lens in addition to a function inherent to the optical device. Accordingly, the optical device has a plurality of light wave control functions, thereby allowing the optical system to be miniaturized and made lightweight. In addition, the micro aspherical lens is integrated into the optical device, thereby eliminating the necessity of adjusting the optical axis at the time of assembly of the optical system. Particularly if the micro aspherical lens is formed integrally with the optical system, the loss of light due to reflection by the surface, or the like is decreased.

A semiconductor laser light source according to an eighth embodiment of the present invention is characterized by comprising a semiconductor laser fixed on a stem, a micro aspherical lens arranged ahead of this semiconductor laser, and a cap covering the semiconductor laser and the micro aspherical lens.

According to the eighth embodiment of the present invention, the semiconductor laser and the micro aspherical lens for collimating or converging light emitted therefrom are contained in the cap. Accordingly, the semiconductor laser light source can be miniaturized and is resistant to external environment, particularly to moisture. In addition, the semiconductor laser can be protected from dust or the like.

An image device according to a ninth embodiment of the present invention is characterized by arranging a plurality of micro aspherical lenses on both surfaces of a transparent substrate with the optical axes of the corresponding micro aspherical lenses on both the surfaces coinciding with each other.

The image device according to the ninth embodiment of the present invention uses the micro aspherical lenses. The fields of vision of the micro aspherical lenses are overlapped with each other by forming the micro aspherical lenses into an array, so that the angle of visual field of each of the lenses need not be increased. Consequently, a blur of an image in its periphery, an irregularity of the amount of light, or the like can be prevented and the image device can be miniaturized and made light weight. Furthermore, this image device can be fabricated by formation or molding using transparent plastic. Accordingly, the image device can be produced in large quantity. Consequently, the image device can be provided at relatively low cost and the image device equal in quality can be produced. In addition, an arbitrary image-formation magnification can be obtained by changing the distance between an object and one lens.

A multi-beam projector according to a tenth embodiment of the present invention is characterized by comprising a light source and a micro lens array arranged ahead of the light source and having a plurality of micro converging lenses arranged in a two-dimensional manner and in that the micro lens array causes a plurality of diffracted light spots in a position far away therefrom.

According to the tenth embodiment of the present invention, light emitted from the light source is converged by the plurality of micro converging lenses constituting the micro lens array, respectively, and diffused and diffracted in a position far away from this position where light is converged. Accordingly, light spots caused by diffraction are formed in a distant position.

According to the tenth embodiment of the present invention, diffracted light spots are formed using the micro lens array constituted by the micro converging lenses arranged on a plane. Accordingly, the spots are not blurred, unlike the case of a fiber grating. In addition, since the micro lens array is a phase modulation type grating, no light is interrupted and almost all light of incident light is used for forming spots, unlike the case of the amplitude modulation type grating, thereby increasing use efficiency of light. Furthermore, light spots are caused by diffraction, so that the change in diameter of the spot relative to the change in distance is small. Additionally, the micro lens array can produce a two-dimensional spot array. Accordingly, if the multi-beam projector is utilized as a shape recognizion equipment, a three-dimensional shape can be recognized. The micro lens array is compact and lightweight, so that the multi-beam projector can be miniaturized and made lightweight. In addition, the micro converging lenses can be produced in large quantity because the reproduction thereof is relatively easy. Consequently, the multi-beam projector can be provided at low cost.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
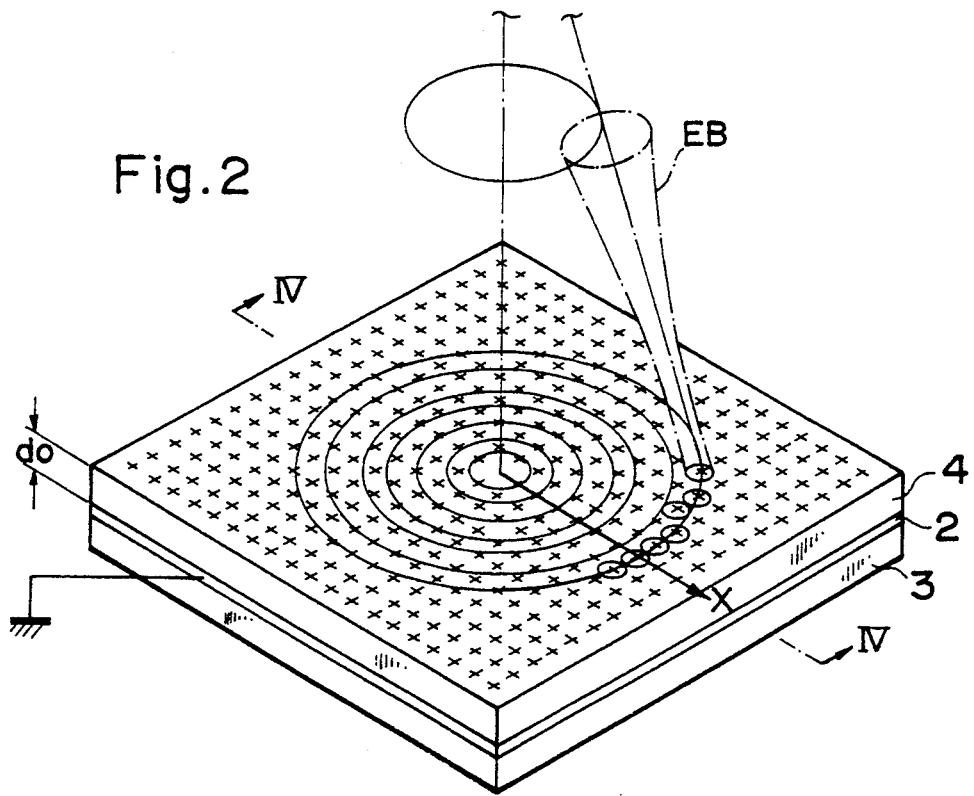
FIG. 2 is a perspective view for explaining a method of fabricating the micro aspherical lens according to the present invention.
Figure 4:
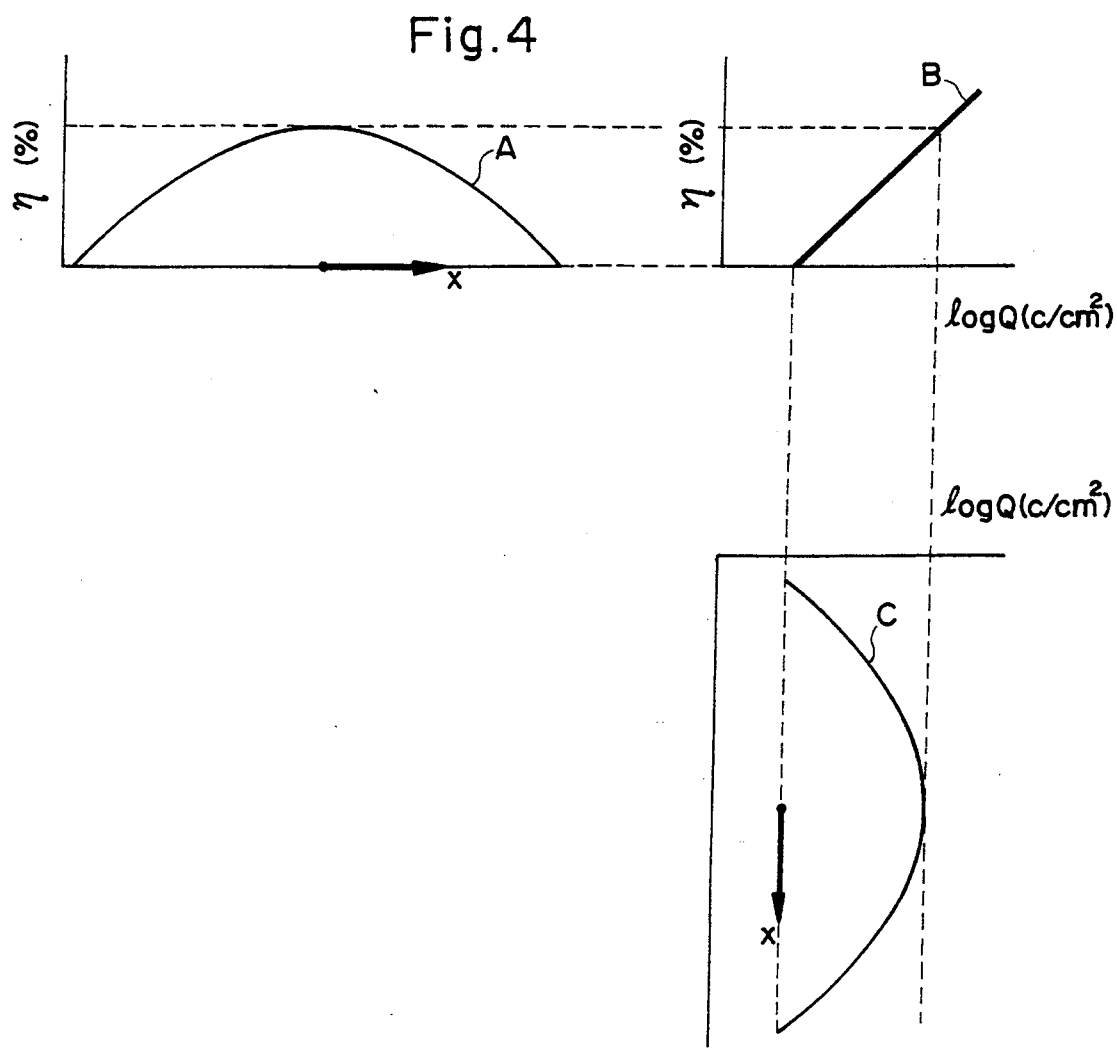
Figure 5:
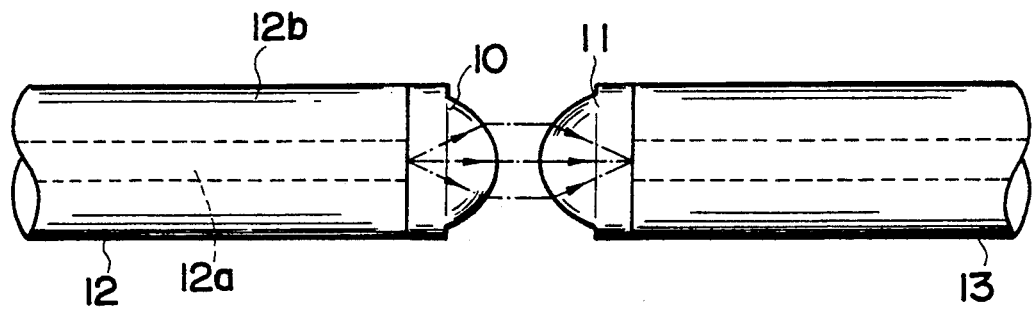
Figure 6:
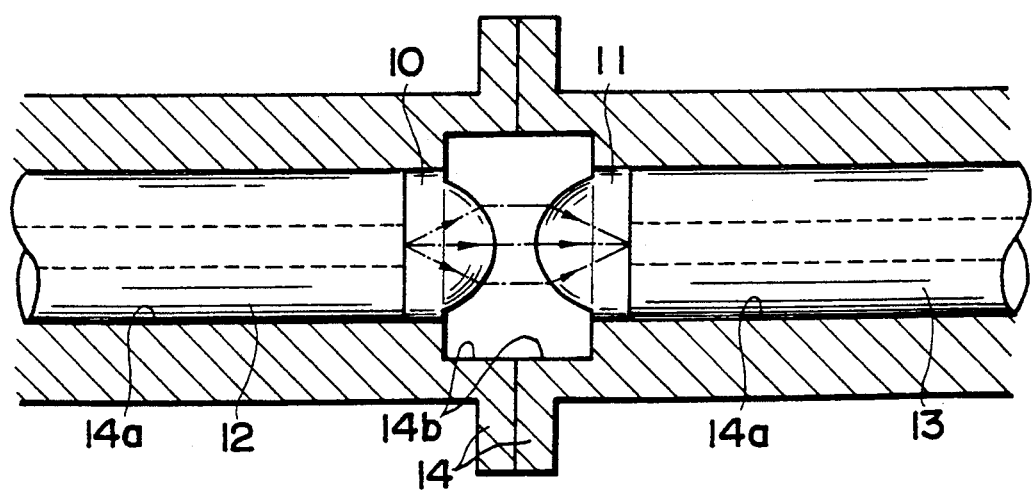
Figure 7:
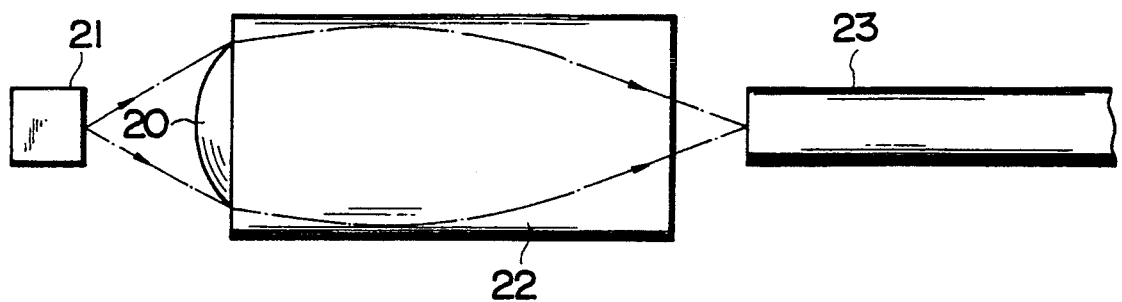
Figure 8:
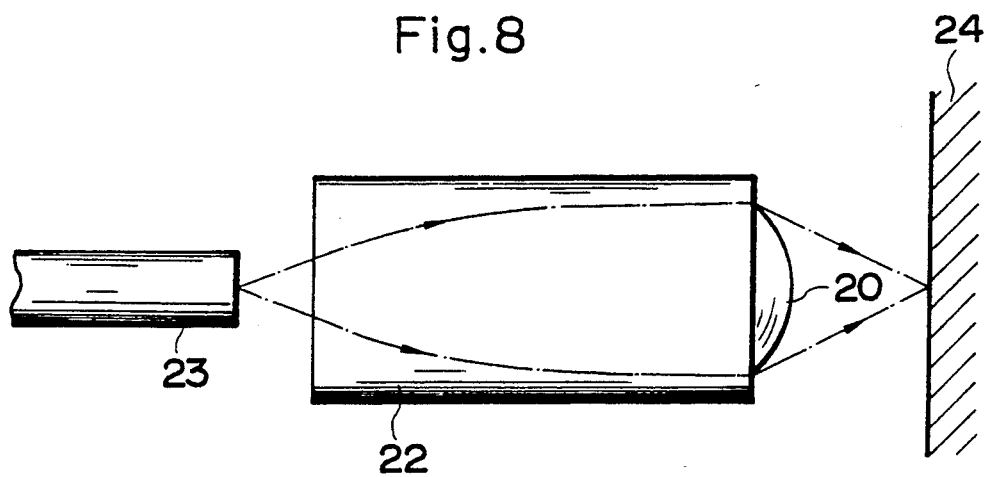
Figure 9:
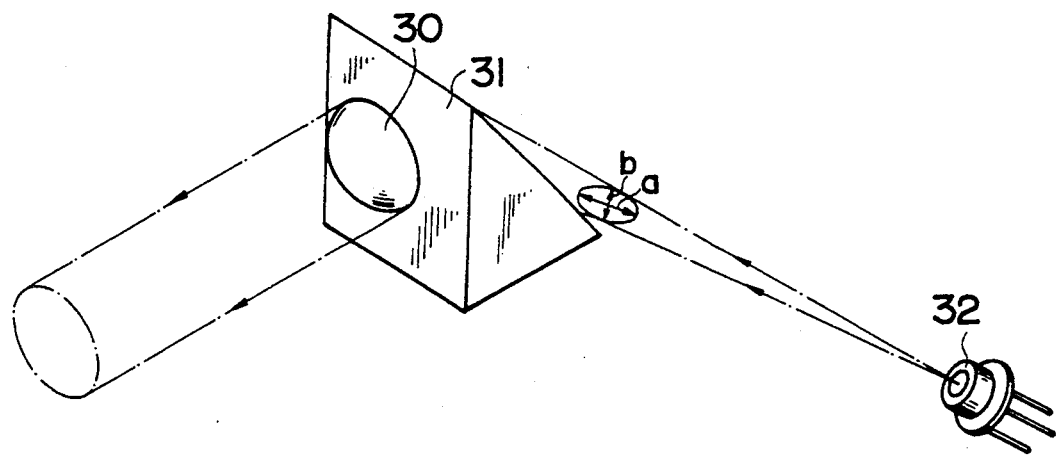
Figure 10:
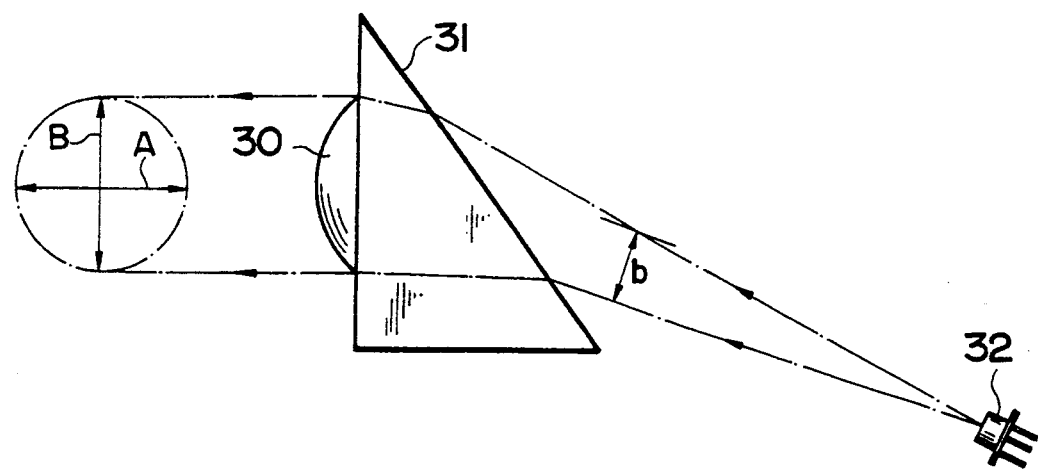
Figure 11:
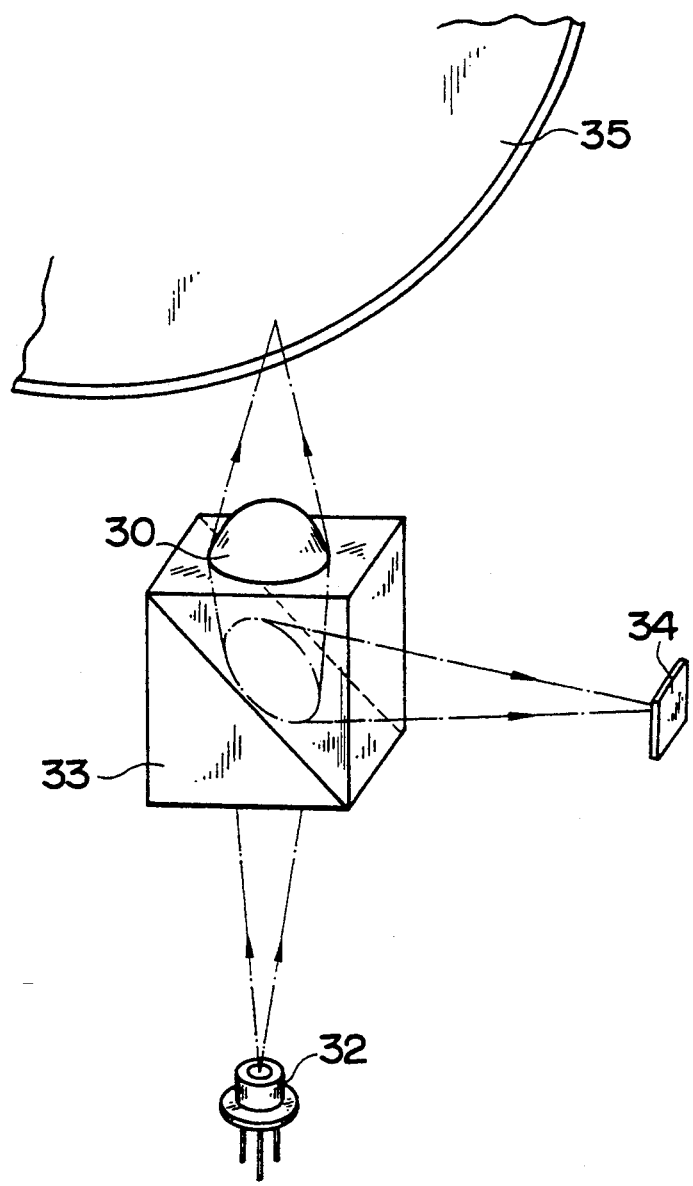
Figure 12:
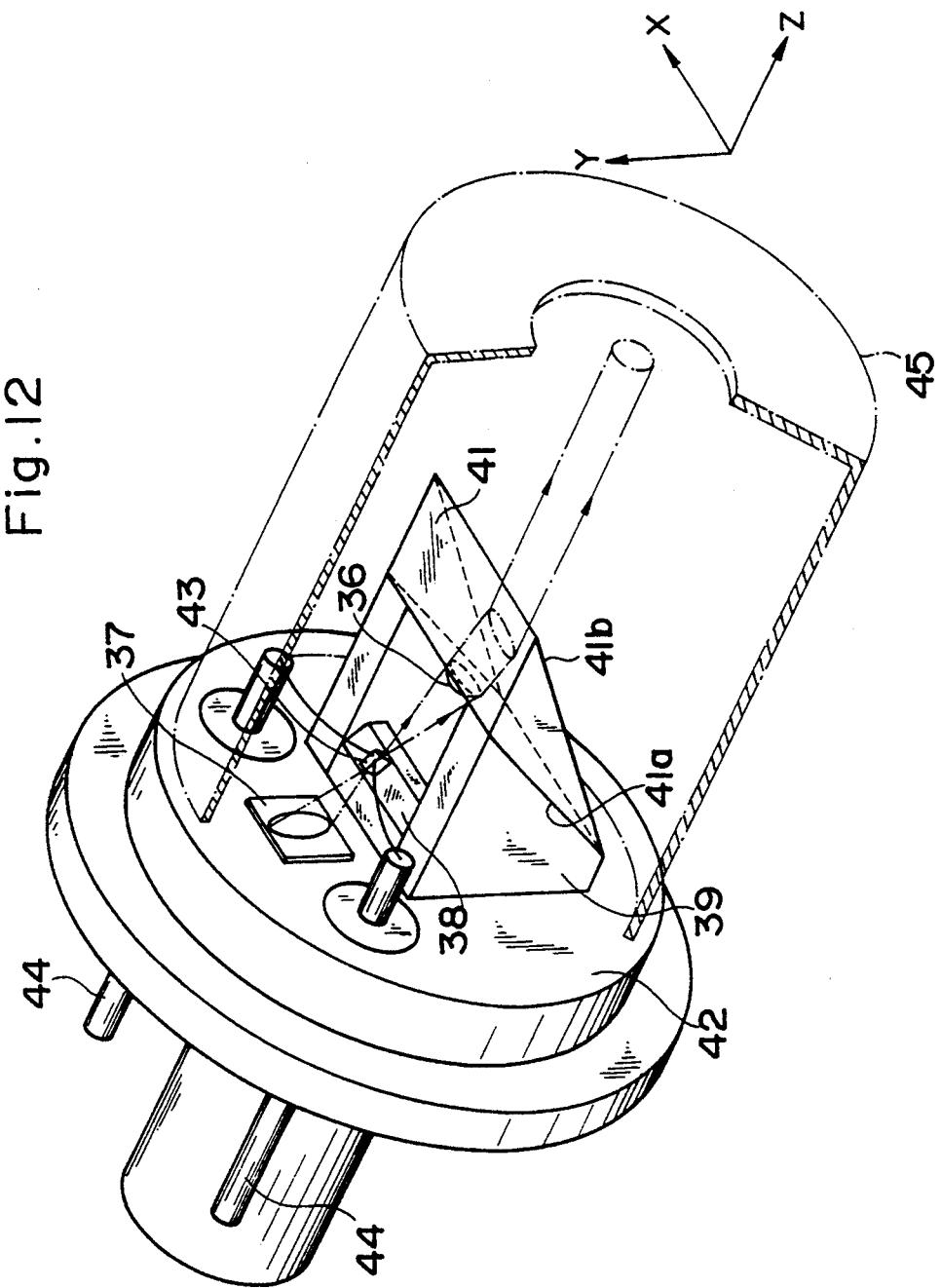
Figure 13:
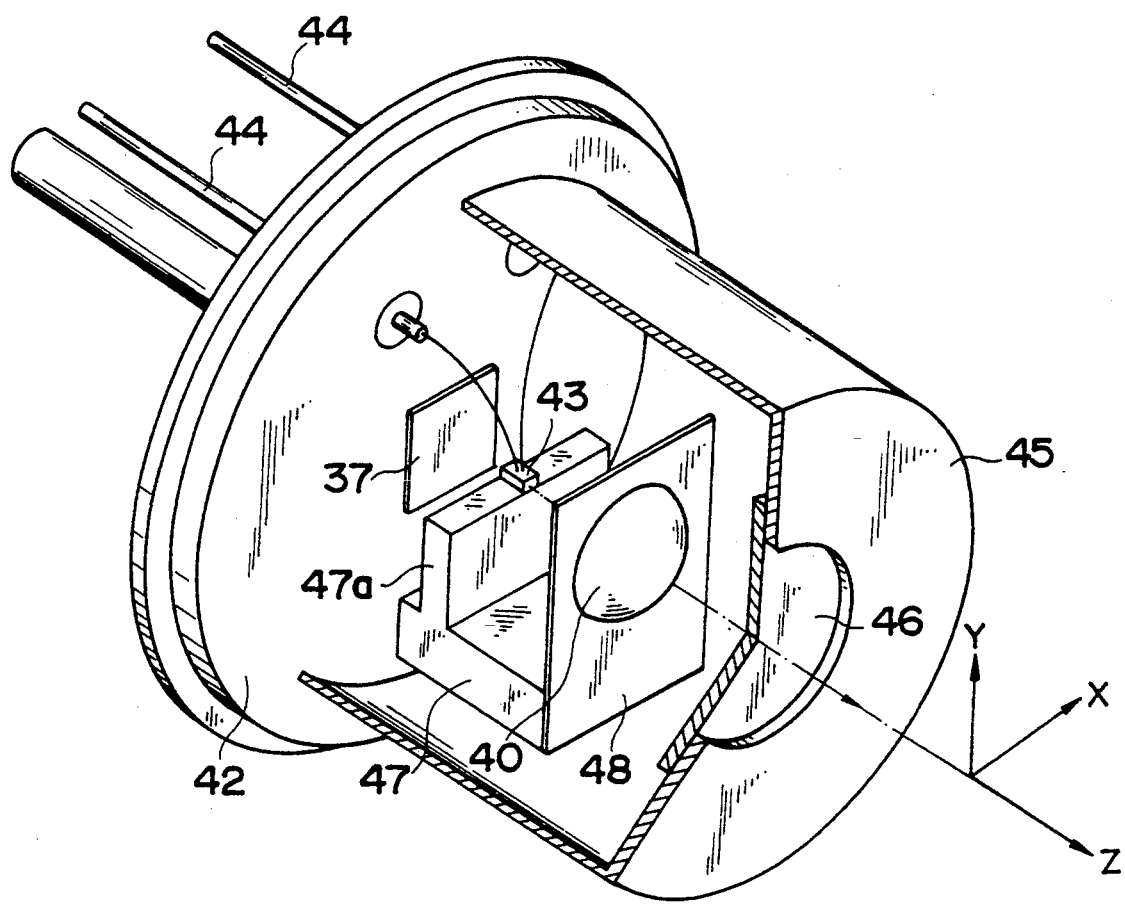
Figure 14:
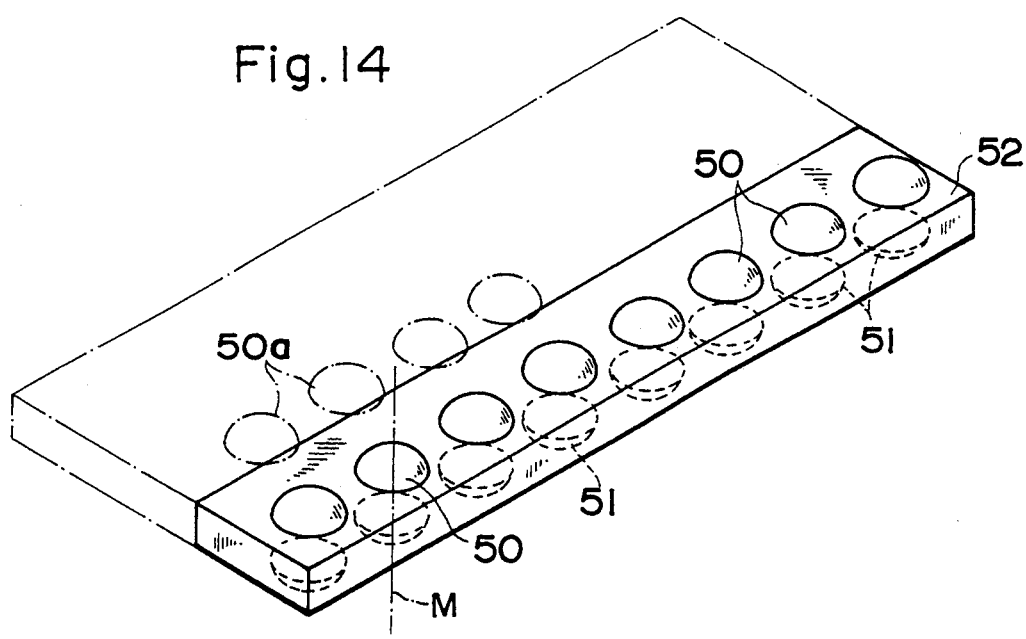
Figure 15:
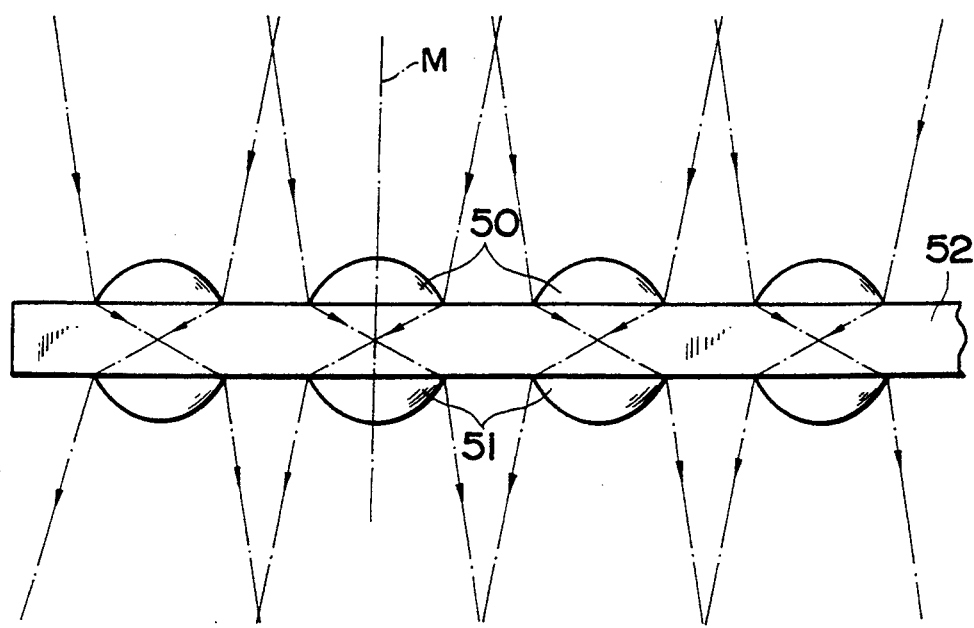
Figure 16:
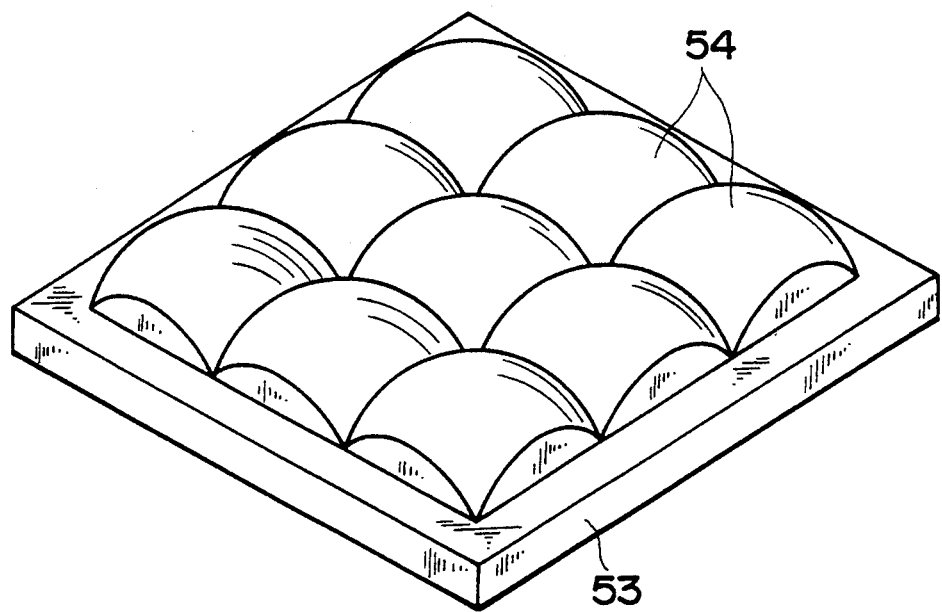
Figure 17:
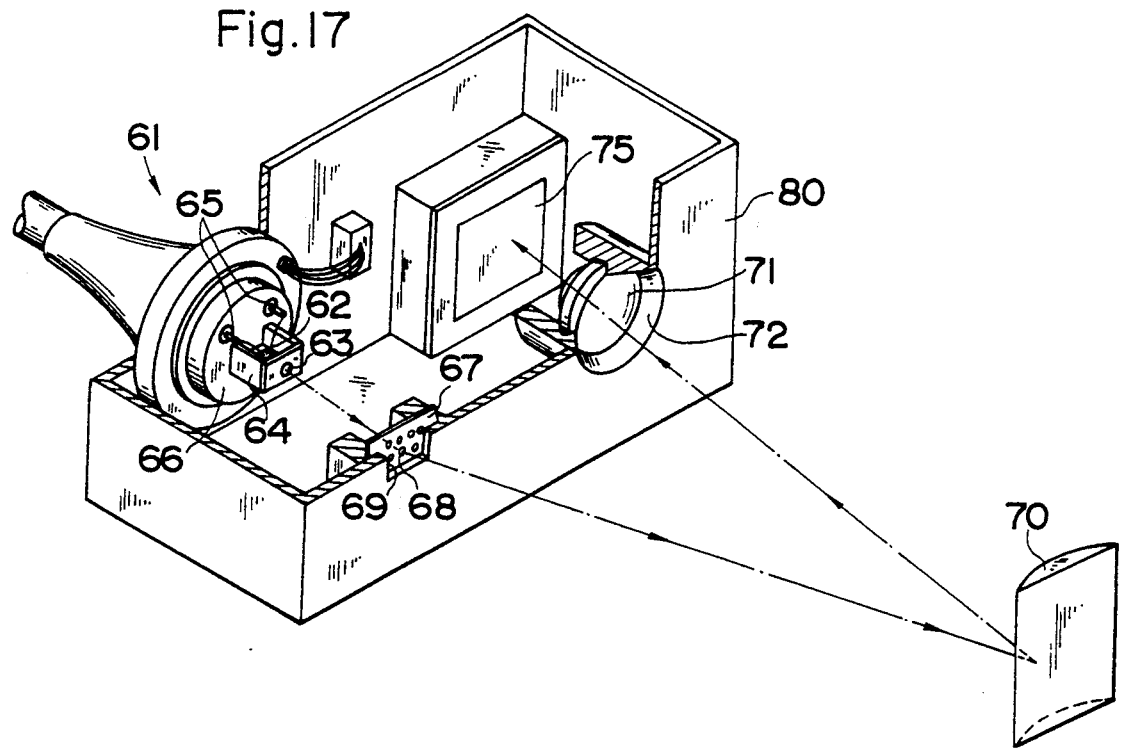
Figure 18:
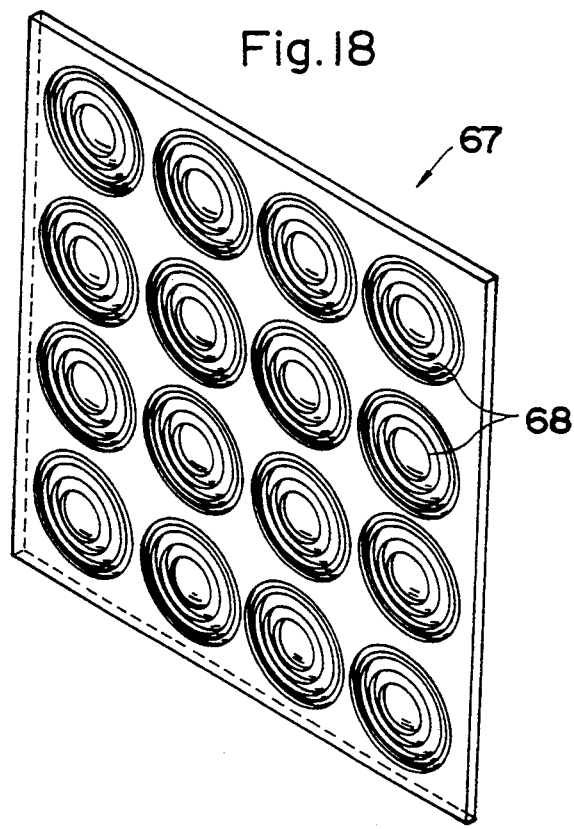
Figure 21:
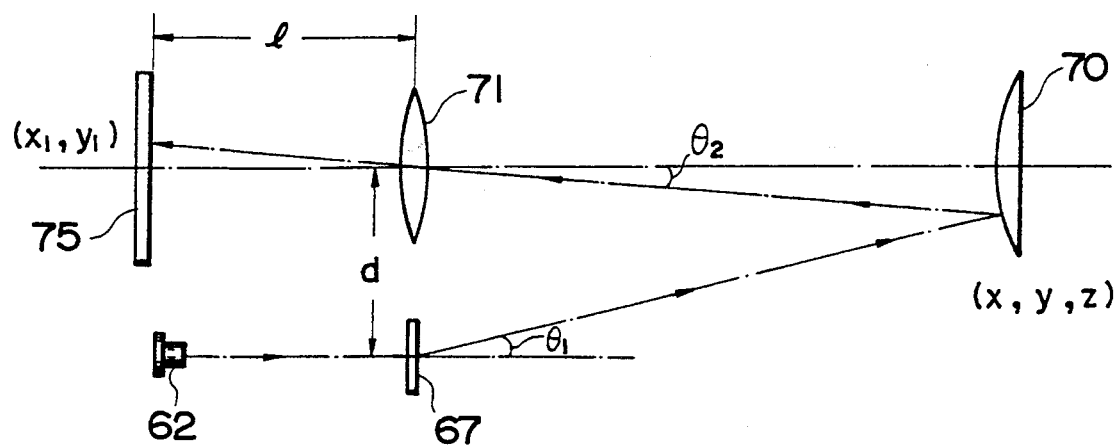
Figure 22:
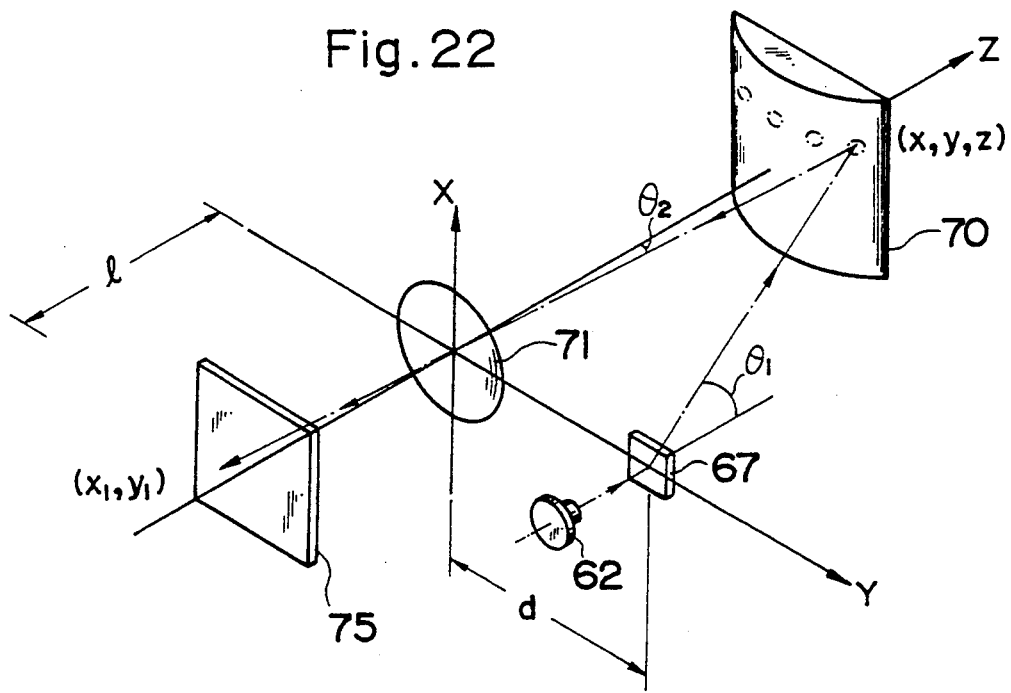
Figure 23:
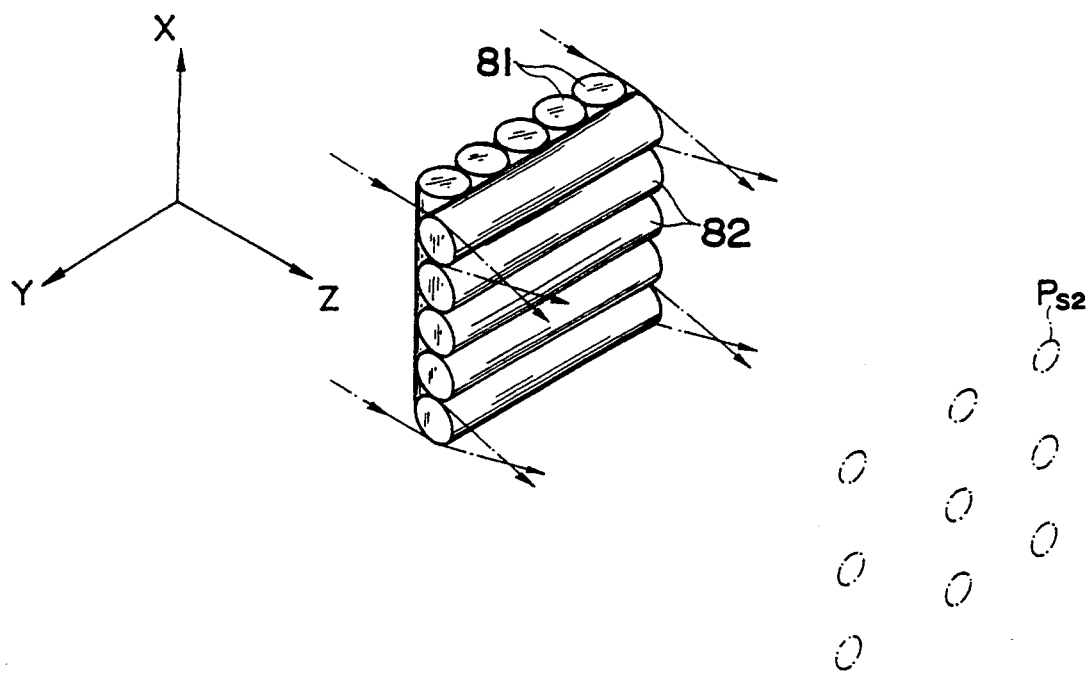
Figure 24A:
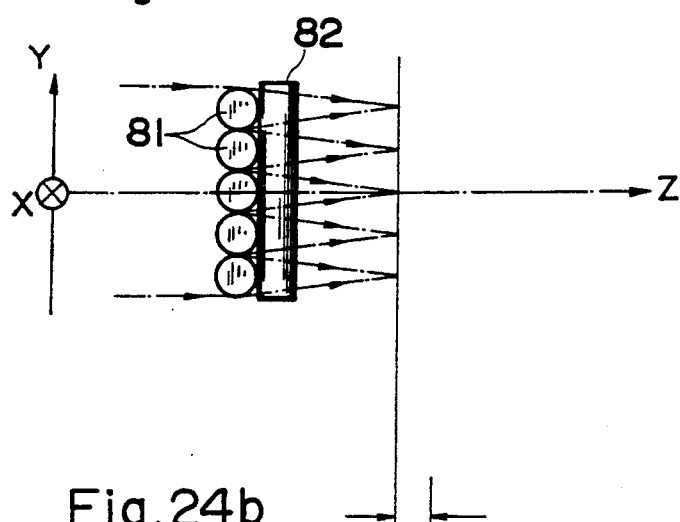
Figure 24B:
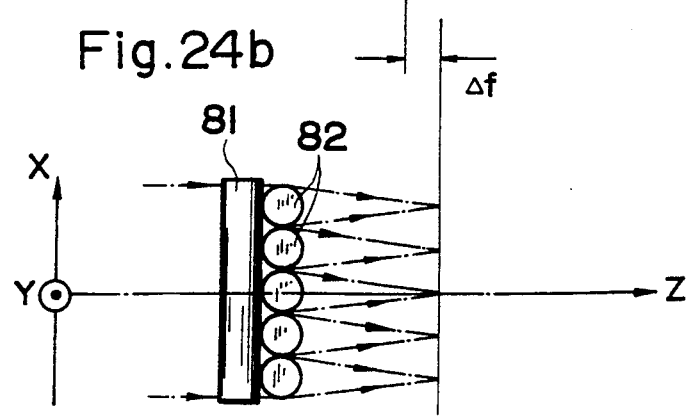
Figure 25:
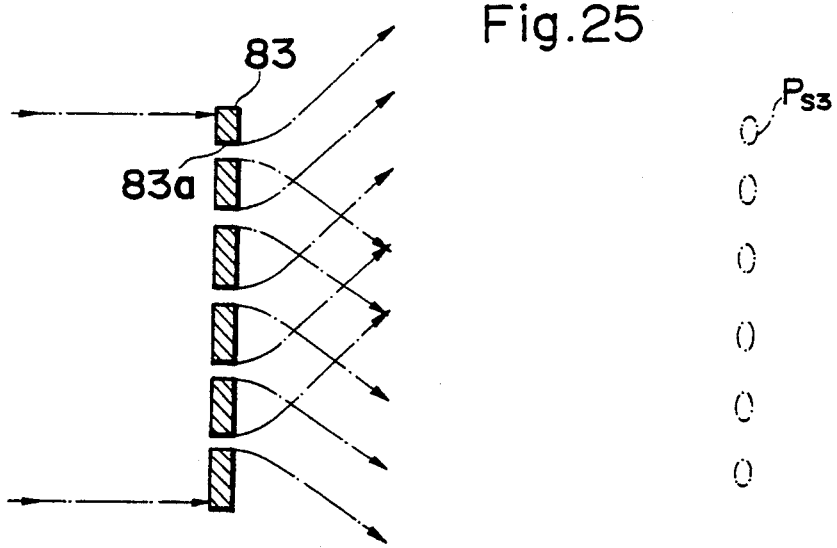
Figure 26:
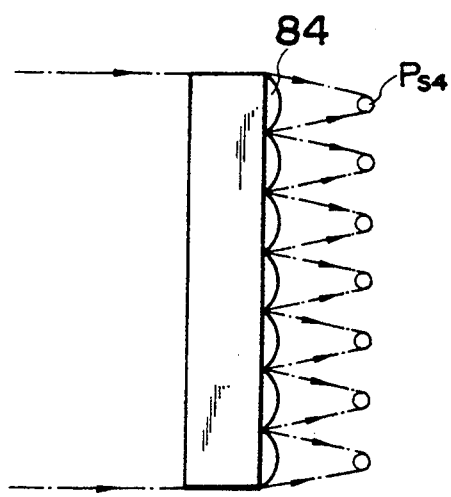
Figure 27:
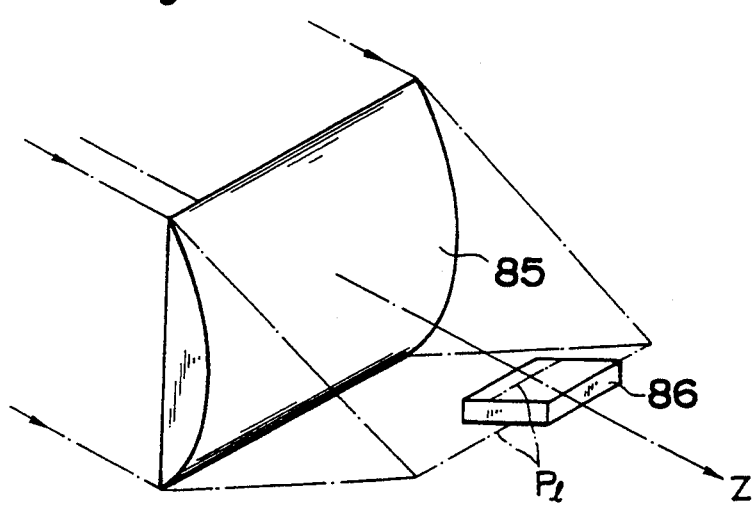

FIG. 4 is a graph, a curve A showing the percentage of the remaining resist in a cross section along a line IV—IV shown in FIG. 2, a curve B showing the relation between the irradiation intensity of the electron beam and the percentage of the remaining resist, and a curve C showing the irradiation intensity distribution of the electron beam satisfying the percentage of the remaining resist represented by the curve A;

FIG. 5 is a side view illustrating an optical fiber coupling device;

FIG. 6 is a sectional side elevation view illustrating an optical fiber coupling device in which micro aspherical lenses are adhered to two optical fibers and the micro aspherical lenses and the optical fibers are incorporated into a connector to couple the optical fibers together;

FIGS. 7 and 8 are diagrams showing an embodiment of a focusing optical system, where FIG. 7 shows an example in which the focusing optical system is applied to optical coupling, and FIG. 8 shows an example in which the focusing optical system is applied to optical measurement;

FIGS. 9 to 12 are diagrams showing an embodiment of an optical device, where FIG. 9 is a perspective view illustrating the optical device in which elliptical light is changed into parallel light using a micro aspherical lens, FIG. 10 is a cross-sectional view illustrating the optical device shown in FIG. 9, FIG. 11 is a perspective view illustrating an optical pick-up device, and FIG. 12 is a perspective view illustrating a semiconductor laser light source utilizing the optical device;

FIG. 13 is a partially cutaway view illustrating a semiconductor laser light source using a micro aspherical lens;

FIGS. 14 and 15 are respectively a perspective view and an enlarged cross-sectional view showing an embodiment of an image device;

FIG. 16 is a perspective view showing an embodiment of an optical device having a lot of micro aspherical lenses;

FIG. 17 is a perspective view showing the appearance of a shape recognition equipment;

FIG. 18 is a perspective view illustrating a micro Fresnel lens array;

FIG. 19 is a diagram showing a state where light is diffracted by the micro Fresnel lens array and the intensity of the diffracted light;

FIG. 20 is a diagram showing a state where light is diffracted by an amplitude modulation type grating and the intensity of the diffracted light;

FIGS. 21 and 22 are respectively a plan view and a perspective view showing the principle of the shape recognition;

FIGS. 23 to 26 are diagrams showing an example of a conventional optical system projecting a spotlight, where FIG. 23 is a perspective view illustrating a fiber grating, FIGS. 24a and 24b are diagrams for explaining a blur of the spotlight produced by the fiber grating, FIG. 25 is a side view illustrating an amplitude modulation grating, and FIG. 26 is a side view illustrating an incoherent type lens array; and FIG. 27 is a perspective view illustrating a cylindrical lens.

DESCRIPTION OF THE PREFERRED EMBODIMENTS

Figure 1:
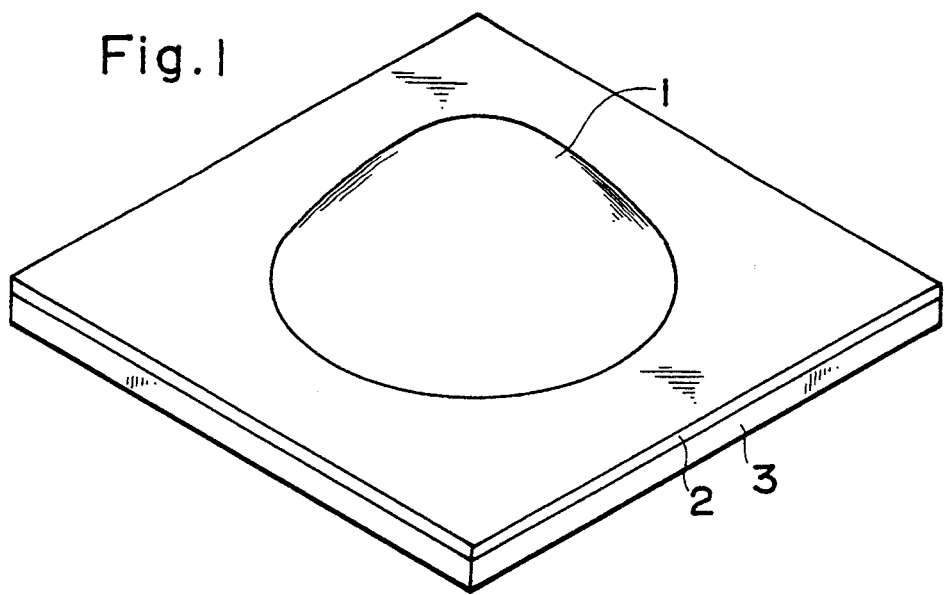
FIG. 1 is a perspective view showing the appearance of a micro aspherical lens.

FIG. 1 is a perspective view showing the appearance of a micro aspherical lens 1 or the prototype thereof, and FIG. 2 is a diagram showing the electron-beam lithography process in a method of fabricating the same.

A micro aspherical lens 1 or the prototype thereof is fabricated by forming a conductive film 2 (for example, indium tin oxide ITO=$In_2O_3+SnO_2$) on a predetermined substrate 3 made of glass or the like, applying an electron-beam resist 4 thereon to a constant thickness $d_O$, writing the pattern of an aspherical lens to be fabricated on the resist by an electron-beam lithography system while controlling a dose of an electron beam EB and then, developing the resist.

The above described method of fabricating the micro aspherical lens will be described in detail.

First, the substrate 3 is cleaned so as to remove the dirt adhered on the substrate 3.

The electron-beam resist 4 is uniformly applied over the substrate 3. The conductive film (for example, ITO) 2 has been formed on the substrate 3 so as to cause the electric charge with which the resist 4 is charged to escape at the time of electron-beam lithography. The thickness of the resist 4 becomes 1 to 2 $\mu$m by applying the resist once. The resist 4 must have a thickness $d_O$ larger than the thickness of a micro aspherical lens to be fabricated. Accordingly, application of the resist and baking thereof are repeated a plurality of times, thereby causing the resist 4 to be increased to a thickness of approximately 10 $\mu$m (multiple coating). A conductive resist may be applied instead of forming the conductive film 2 for causing the charge to escape. However, the resist is not often charged with the charge if the resist 4 has a thickness of up to approximately 5 to 6 $\mu$m. Consequently, application of the conductive resist or formation of the conductive film 2 is not necessarily required.

Then, the pattern of an aspherical lens to be fabricated is written on the resist 4 by the electron-beam lithography system. The amount of irradiation (dose) of the electron beam to be irradiated on the resist has been previously calculated as follows.

Description is now made of the amount of irradiation of the electron beam in a case where the lens 1 is formed of the remaining resist as shown in FIG. 1 using a negative type electron-beam resist.

Figure 3:
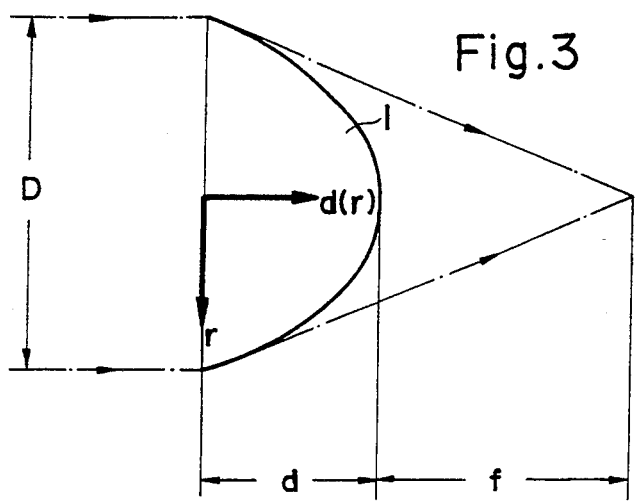
FIG. 3 is a diagram showing the relations between the micro aspherical lens to be fabricated and its values.

Referring to FIG. 3, let n, f, D and d be respectively the refractive index, the focal length, the diameter, and the thickness of a micro aspherical lens to be fabricated. A function d (r) of the thickness distribution of such a micro aspherical lens is given in the following equation:

$$d(r)=d-(1/(n+1))\{f-[f^2+(n+1)\ r^2/\ (n-1)]^{\frac{1}{2}}\} \quad (1)$$

where r is the distance from the center of the lens 1.

Let $d_O$ be the initial thickness of the resist 4. In this case, a percentage $\eta(x)$ of the remaining resist is represented by the following equation using the equation (1):

$$\eta(x)=1/d_O \\ \{d-(1/(n+1))[f-(f^2+(n+1)x^2/(n-1))]^{\frac{1}{2}}\}\times 100\% \quad (2)$$

where x is the distance from the center of the remaining resist.

A curve A in FIG. 4 represents the percentage $\eta(x)$ of the remaining resist, which is expressed by the equation (2), in cross section taken along a line IV—IV in FIG. 2. A curve B in FIG. 4 is a resist sensitivity curve showing the relation between the irradiation intensity (log Q) of the electron beam EB by the electron-beam writing apparatus and the percentage $\eta(x)$ of the remaining resist. This resist sensitivity curve is inherent to each resist. From the two curves A and B, the irradiation intensity distribution of the electron beam EB satisfying the percentage $\eta(x)$ of the remaining resist is as shown in a curve C. More specifically, if the electron beam EB is irradiated on the resist 4 so as to satisfy the irradiation intensity distribution, the remaining resist (the micro aspherical lens or the prototype thereof) having a desired percentage $\eta(x)$ of the remaining resist (a desired function of thickness distribution of the lens as described later) is obtained.

The electron beam EB is scanned on concentric circles in the electron-beam writing apparatus, to write the pattern of the irradiation intensity distribution represented by the curve C on the resist 4.

Thereafter, the resist 4 is developed, thereby allowing the pattern of the remaining resist to be obtained. This pattern becomes a micro aspherical lens or the prototype thereof.

The prototype of the micro aspherical lens thus obtained may be transferred onto the substrate by dry etching utilizing the prototype as a mask, to be the micro aspherical lens or the prototype thereof.

The micro aspherical lens can be produced in large quantity by other methods such as formation or molding. On this occasion, a stamper must be made. Various methods of fabricating the stamper have been known.

For example, a prototype having a concave portion in the form of a micro aspherical lens is made by electron-beam lithography using a positive type electron-beam resist in amounts of irradiation of the electron beam represented by the curve C in FIG. 4. Alternatively, a prototype having a concave portion in the form of the micro aspherical lens is made by electron-beam lithography using a negative type electron-beam resist in amounts of irradiation (a value obtained by subtracting the value of the curve C from a given amount of irradiation) reverse to the curve C. This prototype may be transferred onto the substrate by dry etching, to form a micro aspherical lens using the substrate as a stamper (see Japanese Patent Application Laid-Open Publication No. 62-161532). In addition, a stamper is formed by the plating or electroforming process using the remaining resist pattern on the substrate as shown in FIG. 1 as a male stamper, to form a micro aspherical lens using this stamper (Japanese Patent Application Laid-Open Publication No. 62-161533).

FIG. 5 shows the outline of the construction of an optical fiber coupling device. Referring to FIG. 5, an optical fiber 12 (13) has a double structure comprising a core 12a having a high refractive index and a clad 12b having a refractive index lower than that of the core 12a and surrounding over the core 12a. If light is incident on such an optical fiber 12, a beam of the light propagates through the core 12a while being totally reflected from a boundary surface between the core 12a and the clad 12b.

Two micro aspherical lenses 10 and 11 are adhered to ends of the two optical fibers 12 and 13 arranged with the ends thereof being opposed to each other with optical adhesives such as ultraviolet (UV) curing or hardening resin or epoxy resin.

The light beam propagated through the optical fiber 12 is emitted to the exterior after being converted into ollimated light by the micro aspherical lens 10 adhered to the end of the optical fiber 12 and then, is converged by the micro aspherical lens 11, to be introduced into the optical fiber 13 and propagated therethrough.

In such construction of the optical fiber coupling device, the cores of the optical fibers 12 and 13 need not be precisely matched to each other and the micro aspherical lenses cause no aberration. Consequently, coupling efficiency is not reduced.

FIG. 6 is a sectional side elevation view showing a state where micro aspherical lenses are adhered to optical fibers and the micro aspherical lenses and the optical fibers are incorporated into a connector, thereby to couple the two optical fibers together.

In FIG. 6, connectors 14 are provided with holes 14a for inserting optical fibers 12 and 13 and fixing the same and holes 14b of size larger than that of the holes 14a in positions where micro aspherical lenses 10 and 11 are attached. The optical fibers 12 and 13 are inserted into the holes 14a and fixed thereto. The micro aspherical lenses 10 and 11 are adhered to the optical fibers 12 and 13 in the holes 14b such that their convex surfaces are opposed to each other. The connectors 14 are fixed to each other by a screw or packing.

The connectors 14 cause the very small micro aspherical lenses and optical fibers to be protected from external forces and prevents characteristics of the lenses from being degraded. Even if the optical fiber coupling device is thus constructed utilizing the connectors, light emitted from one optical fiber 12 is collimated by one micro aspherical lens 10 and this collimated light is efficiently incident on the other optical fiber 13 because the collimated light is focused by the other micro aspherical lens 11.

FIGS. 7 and 8 illustrate a focusing optical system.

FIG. 7 shows an example in which the focusing optical system is used for optical coupling between an optical fiber 23 and a light emitting element (or light receiving element) 21. A converging rod lens 22 is arranged between an end of incidence of the optical fiber 23 and the light emitting element 21, and a micro aspherical lens 20 is provided in an end on the side of the light emitting element 21. Light emitted from the light emitting element 21 and diverged is converted into approximately parallel light by the micro aspherical lens 20 and further converged by the rod lens 22, to impinge on the optical fiber 23.

In a case where the light receiving element is used in place of the light emitting element 21, light emitted from the optical fiber 23 is converted into approximately parallel light and converged by the micro aspherical lens 20, to impinge on the light receiving element.

In the construction shown in FIG. 7, the focusing optical system can be miniaturized and optical coupling high in efficiency can be further achieved. In addition, the micro aspherical lens 20 and the converging rod lens 22 are directly fixed to each other, resulting in an improvement in the resistance to environment such as vibration and change in temperature. Furthermore, the number of parts is small, thereby making it easy to adjust the optical axis. Consequently, the focusing optical system can be relatively easily processed.

FIG. 8 shows an example in which the focusing optical system is used for optical measurement. Light emitted from an optical fiber 23 is converted into parallel light by a converging rod lens (collimating lens) 22 and is converged by a micro aspherical lens 20 provided in a top end of the rod lens 22 such that a spot is formed on the surface of an object 24.

As obvious from FIG. 8, the focusing optical system using the micro aspherical lens can be miniaturized. In addition, in the focusing optical system, a high NA and a large operating distance can be achieved.

The micro aspherical lens is thus provided in the end of the converging rod lens in the following methods.

(1) An electron-beam resist is applied to an end of the converging rod lens, the pattern of a micro aspherical lens to be fabricated is written on this electron-beam resist by an electron-beam lithography system and then, the resist is developed, to fabricate a micro aspherical lens formed of the resist. Alternatively, the remaining resist pattern is transferred onto the end of the rod lens by dry etching or the like.

(2) A micro aspherical lens is separately formed and adhered to the end of the converging rod lens by optical bonding or the like.

(3) A micro aspherical lens is formed at the end of the converging rod lens by the formation or molding process.

(4) A micro aspherical lens is formed at the end of the converging rod lens by a light hardening resin.

FIGS. 9 and 10 show a first embodiment of an optical device.

A micro aspherical lens 30 is provided on one of two vertical surfaces of a prism 31. The micro aspherical lens 30 performs the functions of collimating diverged light emitted form a semiconductor laser 32 and converging the collimated light.

A laser beam emitted from the semiconductor laser 32 is elliptical in cross section. Accordingly, this laser beam must be converted into a light beam round in cross section when the laser beam is incident on an optical fiber or it is utilized for another purpose. The prism 31 performs the function of converting a cross-sectional pattern of such a light beam.

A laser beam having a cross-sectional pattern of an ellipse with a diameter of a in the direction of its major axis and a diameter of b in the direction of its minor axis is incident on an inclined surface of the prism 31 in such a direction that the diameter b is increased (except that the diameter b is increased by divergence) and the diameter a is not changed. The diverged light beam which is incident on the prism 31 is then collimated by the micro aspherical lens 30.

If the angle of incidence of the laser beam is suitably selected using the prism 31 having a suitable angle and the focal length of the micro aspherical lens 30 is further suitably determined, collimated light round in cross section having equal diameters A and B in the longitudinal and transverse directions can be obtained.

A transparent substrate having the micro aspherical lens 30 formed thereon may be adhered to one surface of the prism 31. Alternatively, the micro aspherical lens 30 and the prism 31 may be integrally formed.

The micro aspherical lens 30 can be fabricated by the above described fabricating method and can be also reproduced.

When the micro aspherical lens 30 and the prism 31 are integrally formed by a synthetic resin or the like, a stamper can be fabricated by the combination of the stamper made by the above described method of fabricating the stamper and a stamper of the prism. Alternatively, a stamper may be fabricated using the prism as the above described substrate to form the above described lens pattern on one surface of the prism and using the prism having the lens pattern as a prototype.

FIG. 11 shows a second embodiment of an optical device, illustrating an optical pick-up device for reading information recorded on an optical disk depending on the position, the size or the like of a pit. A micro aspherical lens 30 serving as an objective lens is provided on one surface of an optical beam splitter 33. This optical device will be constructed by adhering the micro aspherical lens 30 to one surface of the optical beam splitter 33.

A laser beam emitted from a semiconductor laser 32 and diverged is converged on an optical disk 35 by the micro aspherical lens 30 provided on one surface of the optical beam splitter 33 through the optical beam splitter 33. Light reflected from the optical disk 35 is deflected by the optical beam splitter 33 while being converged through the micro aspherical lens 30, to form a spot on a photodiode 34. An output signal of the photodiode 34 becomes a reading signal of information.

As described in the foregoing, the micro aspherical lens 30 is provided on one surface of the beam splitter 33. Accordingly, an ordinary glass lens need not be arranged as an objective lens separately from the beam splitter. Consequently, the optical system is simplified and miniaturized.

In FIG. 11, a collimating lens may be provided between the semiconductor laser 32 and the beam splitter 33, if necessary. In this case, a light receiving lens for converging reflected light must be arranged between the beam splitter 33 and the photodiode 34. It is preferable to constitute the collimating lens and the light receiving lens by micro aspherical lenses and respectively adhere the micro aspherical lenses to corresponding surfaces of the beam splitter 33 similarly to the micro aspherical lens 30. In some cases a quarter wavelength plate is arranged between the beam splitter 33 and the semiconductor laser 32. In this case, the beam splitter 33 will be a polarized beam splitter. In addition, when the three-beam method is used for controlling tracking and focusing, a diffraction grating is arranged so as to divide a beam emitted from the semiconductor laser 32 into three beams.

FIG. 12 shows a third embodiment of an optical device, which is an applied example of the optical device shown in FIG. 9. FIG. 12 is a partially cutaway view illustrating a semiconductor laser light source.

A heat sink 38 is fixed around a central position of a stem 42. This heat sink 38 may be formed integrally with the stem 42. An upper surface of a top end of the heat sink 38 is formed into an inclined surface. A semiconductor laser 43 is fixed to this inclined surface.

A photodetector 37 is fixed to the stem 42 behind the semiconductor laser 43. The photodetector 37 is used for receiving light emitted from the semiconductor laser 43 and feeding back the output signal to a driving circuit of the semiconductor laser 43, thereby to make the amount of light emitted from the semiconductor laser 43 constant.

A prism 41 having a micro aspherical lens 36 formed on its one surface 41a or adhered thereto is arranged ahead of the semiconductor laser 43. The prism 41 is fixed to top ends of two supporting blocks 39 at both ends thereof. The supporting blocks 39 are fixed to the stem 42 on both sides of the heat sink 38. The prism 41 has two surfaces 41a and 41b having different angles of inclination. The optical axis of the semiconductor laser 43 is perpendicular to the surface 41a provided with the micro aspherical lens 36. Light emitted from the semiconductor laser 43 has different angles in two directions, that is, the X direction and the Y direction and has an elliptical shape in cross section. The micro aspherical lens 36 has such an elliptical pattern that the light emitted from the semiconductor laser 43 is converted into parallel light. The light made parallel by the micro aspherical lens 36 is perpendicularly incident on the surface 41a of the prism 41. The prism 41 performs the functions of converting incident light elliptical in cross section into light round in cross section and deflecting the same such that the direction of emission is perpendicular to the surface of the stem 42. In the present embodiment, the diameter a of the major axis of the elliptical pattern is reduced, thereby causing laser light to be round in shape, unlike the first embodiment.

A cap 45 is provided (represented by a dot and dash line) so as to cover the whole of the heat sink 38 having the semiconductor laser 43 fixed thereto, the prism 41 provided with the micro aspherical lens 36 and the supporting block 39 having this prism 41 fixed thereto and is fixed to the stem 42 by methods such as can-sealing or adhesion. The top of the cap 45 is provided with a hole and a transparent plate (made of plastic, glass or the like) (not shown) is provided for this hole to constitute a window. Laser light collimated by the micro aspherical lens 36 becomes round in cross section by passing through the prism 41 and is emitted to the exterior through this window.

The semiconductor laser 43 is connected by wire bonding or the like to a terminal 44 which is insulated from the stem.

FIG. 13 is a partially cutaway view illustrating a semiconductor laser light source. In FIG. 13, the same reference numerals are assigned to the same portions as those shown in FIG. 12 and hence, the description thereof is not repeated.

Referring to FIG. 13, a heat sink 47 is fixed perpendicularly to a stem 42 around a central position of the stem 42 so as to be parallel to the central axis Z. This heat sink 45 may be formed integrally with the stem 42. Considering the X and Y axes in two directions orthogonal to the Z axis, the width of the heat sink 45 is long in the X direction and the center of this width is on the Y axis. The heat sink 45 is projected in the Y direction in a place spaced apart from the stem 42 by a predetermined distance in the Z direction, and a semiconductor laser 43 is fixed on this projected portion 47a. This semiconductor laser 43 is provided so as to be positioned on the central axis Z of the stem 42 (this axis becomes the optical axis of light emitted from the semiconductor laser 43).

A transparent substrate 48 provided with a micro aspherical lens 40 is arranged ahead of the semiconductor laser 43. The micro aspherical lens 40 is positioned slightly above the center of the substrate 48, and the central axis Z is arranged so as to pass through the top of the lens 40. The micro aspherical lens 40 receives the light emitted from the semiconductor laser 43 and convertes the same into collimated light. Such a micro aspherical lens 40 may be formed integrally with the transparent substrate 48. Alternatively, a micro aspherical lens 40 separately formed may be affixed to the substrate.

The substrate 48 is fixed to a top end of the heat sink 47 at its lower end.

A cap 45 is provided so as to cover the whole of the heat sink 47 having the semiconductor laser 43 fixed thereto and the substrate 48 provided with the micro aspherical lens 40 and is fixed to the stem 42 by methods such as can-sealing or adhesion. The top of the cap 45 is provided with a hole and a transparent plate 46 (made of plastic, glass or the like) is provided for this hole to constitute a window. Laser light collimated by the micro aspherical lens 40 is emitted to the exterior through this transparent plate 46.

An optical system including the semiconductor laser 43 and the micro aspherical lens 40 is contained in the cap 45. Accordingly, the effect exerted by the external environment is significantly decreased. In particular, the optical system is protected from adhesion of the dust or the like.

FIGS. 14 and 15 illustrate an image device.

Referring to FIGS. 14 and 15, a lot of micro aspherical lenses 50 are formed on the surface of a substrate 52 made of optical materials such as transparent glass or plastic and are aligned. Micro aspherical lenses 51 are also formed on the reverse surface of this substrate 52 and are aligned. Optical axes M of the micro aspherical lenses 50 on the surface of the substrate 52 and the micro aspherical lenses 51 on the reverse surface provided corresponding thereto coincide with each other.

As represented by a dot and dash line in FIG. 14, the width of the substrate 52 can be further increased to provide micro Fresnel lenses in two or more rows (part of the Fresnel lenses in the second row are represented by a dot and dash line 50a) on the surface of the substrate 52. At this time, it is desirable to arrange the lenses 50 in the first row and the lenses 50a in the second row in a zigzag fashion. It goes without saying that the micro aspherical lenses corresponding to the lenses 50a in the second row are provided on the reverse surface of the substrate 52.

The image device having such construction is employed in, for example, a copying machine.

Furthermore, the image device according to the present invention can be fabricated in various methods.

For example, an electron-beam resist is applied over the above described substrate 52, the pattern of micro aspherical lenses is written on the resist by electron-beam lithography system and then, this resist is developed. The remaining resist on the substrate 52 becomes aspherical lenses 50 or 51.

The pattern of the remaining resist on the substrate 52 may be transferred onto the substrate 52 by dry etching, to be the aspherical lenses 50 or 51.

Additionally, the image device comprising the substrate 52 and the aspherical lenses 50 and 51 formed on the surface and the reverse surface thereof can be fabricated by integral formation by a transparent synthetic resin using a stamper previously fabricated.

This stamper can be made by the methods as already described above.

The above described image device can be fabricated by making a stamper of a single micro aspherical lens, forming a lot of micro aspherical lenses by plastic using this stamper, and adhering the aspherical lenses to a glass or plastic substrate.

In the above described manner, the image device according to the present invention can be provided at low cost because it can be produced in large quantity.

Furthermore, as shown in FIG. 15, a lot of micro aspherical lenses 50 and 51 are arranged in close proximity to each other. Accordingly, the fields of view of the respective lenses are overlapped with each other, so that the angle of visual field of each of the lenses need not be increased. Consequently, a blur of an image and an irregularity of the amount of light can be eliminated.

Additionally, according to the present invention, an optical device constructed by providing a lot of micro aspherical lenses 54 adjacent to each other on the glass substrate 53 can be fabricated, as shown in FIG. 16.

FIG. 17 is a partially cutaway view illustrating a head portion of a shape recognizion equipment utilizing a multi-beam projector according to the present invention. The multi-beam projector comprises a semiconductor laser light source 61 and a micro Fresnel lens array 67.

The head portion of the shape recognition equipment is contained in a box 80. A window 69 for projecting light and a window 72 for receiving light are provided at a constant distance in a lateral direction on the front surface of this box 80. The micro Fresnel lens array 67 is attached to the window 69. An objective lens 71 is provided for the window 72. In the box 80, the semiconductor laser light source 61 is provided behind the micro Fresnel lens array 67, and an image device 75 is arranged behind the objective lens FIG. 18 is a perspective view illustrating the micro Fresnel lens array 67. The micro Fresnel lens array 67 is constructed by regularly arranging focusing micro Fresnel lenses 68 having a diameter of approximately several micrometers to several hundred micrometers on one plane. The entire micro Fresnel lens array 67 may be fabricated by, for example, the forming process. Alternatively, the micro Fresnel lens array 67 can be fabricated by adhering a lot of micro Fresnel lenses to a transparent flat plate.

The semiconductor laser light source 61 comprises a laser diode 62. This laser diode 62 is attached to a stem 66 through a heat sink. The laser diode 62 is connected to a terminal 65 by wire bonding or the like. A collimator lens 63 for converting light emitted from the laser diode 62 into collimated light is attached to the stem 66 through a fixing member 64 in front of the laser diode 62. The micro Fresnel lens array 67 is attached such that the collimated light from the collimator lens 63 is perpendicular to the surface of the micro Fresnel lens array 67.

As described in detail later, a lot of diffracted light spots are projected to an object 70 to be detected by the multi-beam projector comprising the semiconductor laser light source 61 and the micro Fresnel lens array 67. Light reflected from the object 70 to be detected is converged on the objective lens 71, to form an image on the image device 75. The image device 75 is, for example, a position sensitive device. A position sensitive device for two-dimensional measurement provided with electrodes in its four sides has been used.

FIG. 19 shows a state where the diffracted light spots are formed by the micro Fresnel lens array 67. In addition, FIG. 20 shows a state where light is diffracted by an amplitude modulation type grating 83 for the purpose of explaining the function of the micro Fresnel lens array In FIG. 20, in the amplitude modulation type grating, light is diffracted in the direction at an angle $\theta_1$ given by the following equation:

$$\theta_1 = \mathrm{Sin}^{-1}(n\lambda/A) \qquad (3)$$

where n is 0 and positive and negative integers (n=0, ±1, ±2, ...), $\lambda$ is the wavelength of light, and $\Lambda$ is the grating cycle (i.e., the distance between holes 83a).

In FIG. 19, collimated light projected into the micro Fresnel lens array 67 from a semiconductor laser light source 61 is converged by each of micro Fresnel lenses 68 on its focal plane. As can be seen from the comparison with FIG. 20, this is equivalent to a case where an amplitude modulation type grating F having holes in the positions of the focal points of the micro Fresnel lenses 68 is arranged. Accordingly, light is spread and diffracted in a position far away from this focal plane. An angle $\theta_1$ of diffraction of diffracted light at this time is represented by the above described equation (3). A grating cycle A becomes a distance between the centers of the adjacent micro Fresnel lenses 68. In the above described manner, a lot of light spots caused by diffraction are formed in a distant position. FIG. 19 (also in FIG. 20) shows spots caused by zero order and ± first order diffracted light and the intensity of the light. Almost all incident light contributes to the formation of spots in the micro Fresnel lens array 67. Accordingly, light spots having the intensity larger than that of the light spots caused by the amplitude modulation type grating are obtained.

Referring now to FIGS. 21 and 22, description is now made of the principle of the shape recognition of an object 70 to be detected. FIGS. 21 and 22 respectively a plan view and a perspective view showing a system of measurement.

Diverged light emitted from a laser diode 62 is changed into collimated light by a collimator lens 63 (not shown in FIGS. 21 and 22). The collimated light is diffracted by a micro Fresnel lens array 67 and irradiated onto the object 70 to be detected. The diffracted light is reflected by the object 70 to be detected and this reflected light causes an image to be formed on one point of an image device 75 through an objective lens 71.

It is assumed that the optical axis of the multi-beam projector is parallel to the optical axis of the objective lens 71. Let d be the distance between the optical axes. The optical axis of the objective lens 71 is called the Z axis, and the center of the objective lens 71 is called the origin. Consider the X and Y axes in a plane perpendicular to the Z axis. The direction connecting the optical axis the multi-beam projector and the optical axis of the objective lens 71 is taken as the Y axis. Let $\theta_1$ and $\theta_2$ be respectively the angle of diffraction of projected light and the angle at which reflected light from the object 70 to be detected intersects the optical axis of the objective lens 71. In addition, let l be the distance between the objective lens 71 and the image device 75.

Let the coordinates of the position of each of light spots caused by diffraction on the object 70 to be detected be (x, y, z) and the coordinates of the position of an image forming point on the image device 75 be ($x_1$, $y_1$).

The coordinates (x, y, z) of the position of the spot caused by diffraction on the object 70 to be detected can be found as follows using the detected position ($x_1$, $y_1$) on the image device 75.

First, from the geometrical property of the optical system (without considering signs x, y, $x_1$ and $y_1$ and in consideration of the absolute value), x, y and z are found as follows:

$$x = (x_1/l)z \quad (4)$$

$$y = (y_1/l)z \quad (5)$$

$$z = d/(\tan \theta_1 + \tan \theta_2) \quad (6)$$

The angle $\theta_1$ in the equation (6) is given by the equation (3), and the angle $\theta_2$ is given by the following equation:

$$\theta_2 = \tan^{-1}(y_1/l) \quad (7)$$

Although in the above described embodiments, the micro Fresnel lens array 67 is attached to the box 80, the micro Fresnel lens array 67 may be attached to the position of the collimator lens 63.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An imaging device comprising:
   a transparent substrate having opposite surfaces;
   a plurality of micro aspherical lenses, each of said micro aspherical lenses disposed upon a surface of said transparent substrate;
   said micro aspherical lenses arranged such that the optical axis of each of said micro aspherical lenses disposed on one of said opposite surfaces coincides with the optical axis of a respective micro aspherical lens disposed on the other of said opposite surfaces;
   said plurality of micro aspherical lenses provided in a plurality of rows on each of said opposite surfaces; and
   said plurality of micro aspherical lenses further provided in a zig-zag pattern on each of said opposite surfaces.

2. An imaging device as claimed in claim 1, wherein said micro aspherical lenses are manufactured by electron-beam lithography.

3. An imaging device comprising:
   a transparent substrate having opposite surfaces; and,
   a plurality of diffraction type micro aspherical lenses, each of said diffraction type micro aspherical lenses disposed upon a surface of said transparent substrate;
   each of said diffraction type micro aspherical lenses arranged such that the optical axis of each of said diffraction type micro aspherical lenses disposed on one of said opposite surfaces coincides with the optical axis of a respective diffraction type micro aspherical lens disposed on the other of said opposite surfaces; and
   said plurality of diffraction type micro aspherical lenses arranged in a singular row on each of said opposite surfaces.

4. An imaging device as claimed in claim 3, wherein said diffraction type micro aspherical lenses are manufactured by electron-beam lithography.

5. An imaging device comprising:
   a transparent substrate having opposite surfaces;
   a plurality of diffraction type micro aspherical lenses, each of said diffraction type micro aspherical lenses disposed upon a surface of said transparent substrate;
   each of said diffraction type micro aspherical lenses arranged such that the optical axis of each of said diffraction type micro aspherical lenses disposed on one of said opposite surfaces coincides with the optical axis of a respective diffraction type micro aspherical lens disposed on the other of said opposite surfaces; and
   said plurality of diffraction type micro aspherical lenses arranged in a plurality of rows on each of said opposite surfaces.

6. An imaging device as claimed in claim 5, wherein said diffraction type micro aspherical lenses are manufactured by electron-beam lithography.

7. A multi-beam projector comprising a light source and a micro lens array having a plurality of micro aspherical lenses arranged two-dimensionally in a zig-zag pattern, said micro lens array receiving light from said light source and causing a plurality of light spots caused by diffraction to be formed in a position displaced therefrom.

8. A multi-beam projector as claimed in claim 7, wherein said micro aspherical lenses are manufactured by electron-beam lithography.

9. A multi-beam projector as claimed in claim 7 further including a light receiver for receiving said light spots after reflection from an object.

10. A multi-beam projector as claimed in claim 9 further including means responsive to said light receiver for determining the shape of said object.

11. A multi-beam projector comprising a light source and a micro lens array having a plurality of diffraction type micro aspherical lenses arranged in a two-dimensional manner, said micro lens array receiving light from said light source and causing a plurality of light spots caused by diffraction to be formed in a position displaced therefrom.

12. A multi-beam projector as claimed in claim 11, wherein said micro aspherical lenses are manufactured by electron-beam lithography.

13. A multi-beam projector as claimed in claim 11 further including a light receiver for receiving said light spots after reflection from an object.

14. A multi-beam projector as claimed in claim 13 further including means responsive to said light receiver for determining the shape of said object.

* * * * *